United States Patent
Li et al.

(10) Patent No.: US 11,405,038 B2
(45) Date of Patent: Aug. 2, 2022

(54) LEVEL SHIFTER CIRCUIT AND DISPLAY PANEL

(71) Applicant: TCL CHINA STAR OPTOELECTRONICS TECHNOLOGY CO., LTD., Shenzhen (CN)

(72) Inventors: Wenfang Li, Shenzhen (CN); Xianming Zhang, Shenzhen (CN)

(*) Notice: Subject to any disclaimer, the term of this patent is extended or adjusted under 35 U.S.C. 154(b) by 0 days.

(21) Appl. No.: 16/627,301

(22) PCT Filed: Nov. 27, 2019

(86) PCT No.: PCT/CN2019/121120
§ 371 (c)(1),
(2) Date: Dec. 29, 2019

(87) PCT Pub. No.: WO2021/097877
PCT Pub. Date: May 27, 2021

(65) Prior Publication Data
US 2021/0152177 A1    May 20, 2021

(30) Foreign Application Priority Data

Nov. 19, 2019  (CN) .......................... 201911132496.7

(51) Int. Cl.
*G09G 3/20*    (2006.01)
*H03K 19/0185*  (2006.01)

(52) U.S. Cl.
CPC ....... *H03K 19/018507* (2013.01); *G09G 3/20* (2013.01); *G09G 2300/0871* (2013.01); *G09G 2310/0289* (2013.01); *G09G 2330/04* (2013.01)

(58) Field of Classification Search
CPC ........ G09G 3/20; G09G 3/36; G09G 2300/08; G09G 2300/0871; G09G 2310/0289;
(Continued)

(56) References Cited

U.S. PATENT DOCUMENTS 9,250,284 B1 *  2/2016  Yang ................ H03K 19/00315
10,587,266 B2 *  3/2020  Zhang ............. H03K 19/00384
(Continued)

FOREIGN PATENT DOCUMENTS

CN    101165986 A    4/2008
CN    101656053 A    2/2010
(Continued)

*Primary Examiner* — Vijay Shankar

(57) ABSTRACT

The present disclosure discloses a level shifter circuit and a display panel. The level shifter circuit includes a level shifter module, a compare module connected to the level shifter module. The level shifter module includes a level shifter unit, a control unit connected to the level shifter unit. The level shifter unit receives a first voltage signal and a second voltage signal and generates a level shifter result signal according to the first voltage signal and the second voltage signal. The compare module is configured to compare a voltage corresponding to the level shifter result signal with a reference voltage at a predetermined time and generate a comparison result. The control unit stops the shifter unit when the voltage corresponding to the level shifter result signal is less than the reference voltage. The present disclosure prevents the display panel from being damaged by short circuiting.

18 Claims, 2 Drawing Sheets

(58) Field of Classification Search
CPC ......... G09G 2330/04; G09G 2330/028; H03K 19/018507
See application file for complete search history.

(56) References Cited

U.S. PATENT DOCUMENTS

| | | |
|---|---|---|
| 2005/0035960 A1 | 2/2005 | Kobayashi |
| 2016/0054368 A1* | 2/2016 | Yang ................ H03K 19/00315 327/333 |
| 2017/0039974 A1 | 2/2017 | Kang et al. |
| 2017/0261800 A1 | 9/2017 | Zhang et al. |
| 2018/0175729 A1 | 6/2018 | Cao |
| 2019/0028103 A1* | 1/2019 | Zhang .................... G09G 5/003 |

FOREIGN PATENT DOCUMENTS

| | | |
|---|---|---|
| CN | 105223713 A | 1/2016 |
| CN | 105448260 A | 3/2016 |
| CN | 105845068 A | 8/2016 |
| CN | 106097992 A | 11/2016 |
| CN | 107452320 A | 12/2017 |
| CN | 107705763 A | 2/2018 |
| CN | 110322855 A | 10/2019 |
| JP | 2000112446 A | 4/2000 |
| JP | 2005176298 A | 6/2005 |

\* cited by examiner

LEVEL SHIFTER CIRCUIT AND DISPLAY PANEL

FIELD OF INVENTION

The present disclosure relates to the field of display technologies, more particularly to a level shifter circuit and a display panel.

BACKGROUND OF INVENTION

In order to achieve narrower bezels, areas for arranging driving circuits become smaller in conventional display panels. In addition, in order to achieve high resolution, the conventional display panels have more signal wires in the driving circuits.

Therefore, the signal lines of the driving circuit in the conventional display panel are arranged more and more densely. In this condition, particles in the display panel are easy to contact the two signal lines, which will cause a short circuiting in the display panel. The short circuiting of the display panel generates heat, which causes polarizing plates of the display panels to melt.

Therefore, it is necessary to provide a new technical solution to prevent the display panels from being damaged due to short circuiting.

SUMMARY OF INVENTION

A objection of the present disclosure is providing a level shifter circuit and a display panel to prevent display panels from being damaged due to short circuiting.

To solve the problems above, the technical solutions of the present disclosure are as following.

A level shifter circuit, wherein the level shifter circuit comprises a level shifter module and a compare module connected to the level shifter module, wherein the level shifter module comprises a level shifter unit and a control unit connected to the level shifter unit; wherein the level shifter unit is configured to receive a first voltage signal and a second voltage signal, and configured to generate a level shifter result signal according to the first voltage signal and the second voltage signal; wherein the compare module is configured to compare a voltage corresponding to the level shifter result signal with a reference voltage at a predetermined time, configured to generate a compare result, and configured to feed back the compare result to the control unit; wherein the control unit is configured to control the level shifter unit to stop operating in response to the compare result that the voltage corresponding to the level shifter result signal is less than the reference voltage; wherein the control unit is configured to control the level shifter unit to normally operate in response to the compare result that the voltage corresponding to the level shifter result signal is greater than or equal to the reference voltage; wherein the compare module comprises a delay controller and a comparator, the delay controller is electrically connected to the comparator and the control unit, and the delay controller is configured to delay a control signal of the control unit for the predetermined time before being transmitted to the comparator; wherein the driving circuit is shorted in response to a condition that the voltage corresponding to the level shifter result signal is less than the reference voltage; and wherein the driving circuit is not shorted in response to a condition that the voltage corresponding to the level shifter result signal is greater than or equal to the reference voltage.

In the level shifter circuit above, the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

A level shifter circuit, wherein the level shifter circuit comprises a level shifter module and a compare module connected to the level shifter module, wherein the level shifter module comprises a level shifter unit and a control unit connected to the level shifter unit; wherein the level shifter unit is configured to receive a first voltage signal and a second voltage signal, and configured to generate a level shifter result signal according to the first voltage signal and the second voltage signal; wherein the compare module is configured to compare a voltage corresponding to the level shifter result signal with a reference voltage at a predetermined time, configured to generate a compare result, and configured to feedback the compare result to the control unit; wherein the control unit is configured to control the level shifter unit to stop operating in response to the compare result that the voltage corresponding to the level shifter result signal is less than the reference voltage.

In the level shifter circuit above, the control unit is further configured to control the level shifter unit to normally operate in response to the compare result that the voltage corresponding to the level shifter result signal is greater than or equal to the reference voltage.

In the level shifter circuit above, the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

In the level shifter circuit above, the control unit is configured to control the first three-end transistor and the second three-end transistor to be turned on or off to generate the level shifter result signal in response to a condition that the voltage corresponding to the level shifter result signal is greater than or equal to the reference voltage at the predetermined time, and configured to control the first three-end transistor and the second three-end transistor to be turned off to stop generating the level shifter result signal in response to a condition that the voltage corresponding to the level shifter result signal is less than the reference voltage at the predetermined time.

In the level shifter circuit above, the level shifter module further comprises a first voltage signal input end, a second voltage signal input end, and a level shifter result signal output end; the first three-end transistor comprises a first control end, a first input end, and a first output end, the first control end is electrically connected to the first control signal output end, the first input end is electrically connected to the first voltage signal input end, and the first output end is electrically connected to the level shifter result signal output end; the second three-end transistor comprises a second control end, a second input end, and a second output end, the second control end is electrically connected to the second control signal output end, the second input end is electrically connected to the second voltage signal input end, and the second output end is electrically connected to the level shifter result signal output end; and the level shifter result signal output end is configured to output the level shifter result signal.

In the level shifter circuit above, the compare module further comprises a delay controller and a comparator, wherein the delay controller is electrically connected to the comparator and the control unit, and the delay controller is configured to transmit a control signal of the control unit to the comparator after delayed for the predetermined time then transmits.

In the level shifter circuit above, the compare module further comprises a delay switch, the delay switch is electrically connected to the delay controller and the comparator and is configured to turn on a current path between the delay controller and the comparator at the predetermined time.

In the level shifter circuit above, the delay controller further comprises a first control signal input end and a third control signal output end, and the first control signal input end is electrically connected to the first control signal output end; and the comparator comprises a reference voltage signal input end, a awaiting-compare voltage signal input end, a second control signal input end, and a compare result signal output end, the second control signal input end is electrically connected to the third control single output end, and the awaiting-compare voltage signal input end is electrically connected to the level shifter result signal output end of the level shifter module.

In the level shifter circuit above, the control unit further comprises a feedback signal input end electrically connected to the compare result signal output end.

A display panel, wherein the display panel comprises a panel main body and a driving circuit, the panel main body is electrically connected to the driving circuit, the driving circuit comprises a level shifter circuit, the level shifter circuit comprises a level shifter module and a compare module connected to the level shifter module, and the level shifter module comprises a level shifter unit and a control unit connected to the level shifter unit; wherein the level shifter unit is configured to receive a first voltage signal and a second voltage signal, and configured to generate a level shifter result signal according to the first voltage signal and the second voltage signal; wherein the compare module is configured to compare a voltage corresponding to the level shifter result signal and a reference voltage at a predetermined time, and configured to generate a compare result, and configured to feedback the compare result to the control unit; and wherein the control unit is configured to control the level shifter unit to stop operating in response to the compare result that the voltage corresponding to the level shifter result signal is less than the reference voltage.

In the display panel above, the control unit is further configured to control the level shifter unit to normally operate in response to the compare result that the voltage corresponding to the level shifter result signal is greater than or equal to the reference voltage.

In the display panel above, the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

In the display panel above, the control unit is configured to control the first three-end transistor and the second three-end transistor to be turned on or off to generate the level shifter result signal in response to a condition that the voltage corresponding to the level shifter result signal is greater than or equal to the reference voltage at the predetermined time; and configured to control the first three-end transistor and the second three-end transistor to be turned off to stop generating the level shifter result signal in response to a condition that the voltage corresponding to the level shifter result signal is less than the reference voltage at the predetermined time.

In the display panel above, the level shifter module further comprises a first voltage signal input end, a second voltage signal input end, and a level shifter result signal output end; the first three-end transistor comprises a first control end, a first input end, and a first output end, the first control end is electrically connected to the first control signal output end, the first input end is electrically connected to the first voltage signal input end, and the first output end is electrically connected to the level shifter result signal output end; the second three-end transistor comprises a second control end, a second input end, and a second output end, the second control end is electrically connected to the second control signal output end, the second input end is electrically connected to the second voltage signal input end, and the second output end is electrically connected to the level shifter result signal output end; the level shifter result signal output end is configured to output the level shifter result signal.

In the display panel above, the compare module further comprises a delay controller and a comparator, wherein the delay controller is electrically connected to the comparator and the control unit, and the delay controller is configured to transmit a control of the control unit to the comparator after delayed for the predetermined time then transmits.

In the display panel above, the compare module further comprises a delay switch, the delay switch is electrically connected to the delay controller and the comparator and is configured to turn on a current path between the delay controller and the comparator at the predetermined time.

In the display panel above, the delay controller further comprises a first control signal input end and a third control signal output end, the first control signal input end is electrically connected to the first control signal output end; the comparator comprises a reference voltage signal input end, a awaiting-compare voltage signal input end, a second control signal input end, and a compare result signal output end, the second control signal input end is electrically connected to the third control single output end, the awaiting-compare voltage signal input end is electrically connected to the level shifter result signal output end of the level shifter module.

In the display panel above, the control unit further comprises a feedback signal input end electrically connected to the compare result signal output end In the above technical solution, because the compare module compares the voltage corresponding to the level shifter result signal with a reference voltage at the predetermined time, and generates a comparison result (signal). The comparison result (signal) is utilized to control the level shifter module to stop generating the level shifter result signal when the voltage corresponding to the level shifter result signal is less than the reference voltage at the predetermined time. Hence, damages resulted from short circuiting can be prevented.

In order to clarify the above content of the present disclosure, the preferred embodiments are described below in detail accompanying with drawings.

DETAILED DESCRIPTION OF PREFERRED EMBODIMENTS

The term "embodiment" in this specification means an example, sample, or illustration. Furthermore, terms "a" and "an" used in this specification and the appended claims can generally be construed as "one or more" unless are specified or are clearly referring to "singular" from context.

Figure 1:
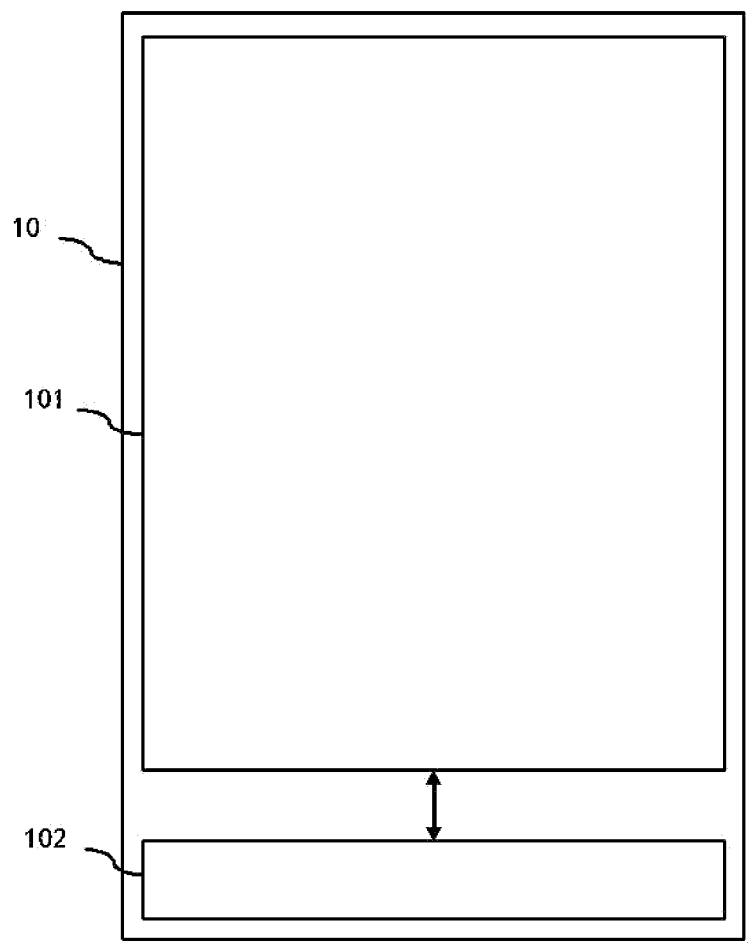
FIG. 1 illustrates a diagram of a display panel of the present disclosure.
Figure 2:
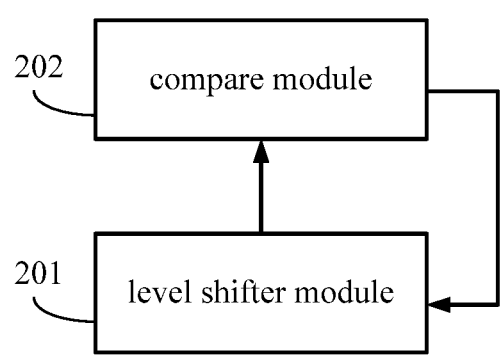
FIG. 2 illustrates a block diagram of a level shifter circuit of the present disclosure.
Figure 3:
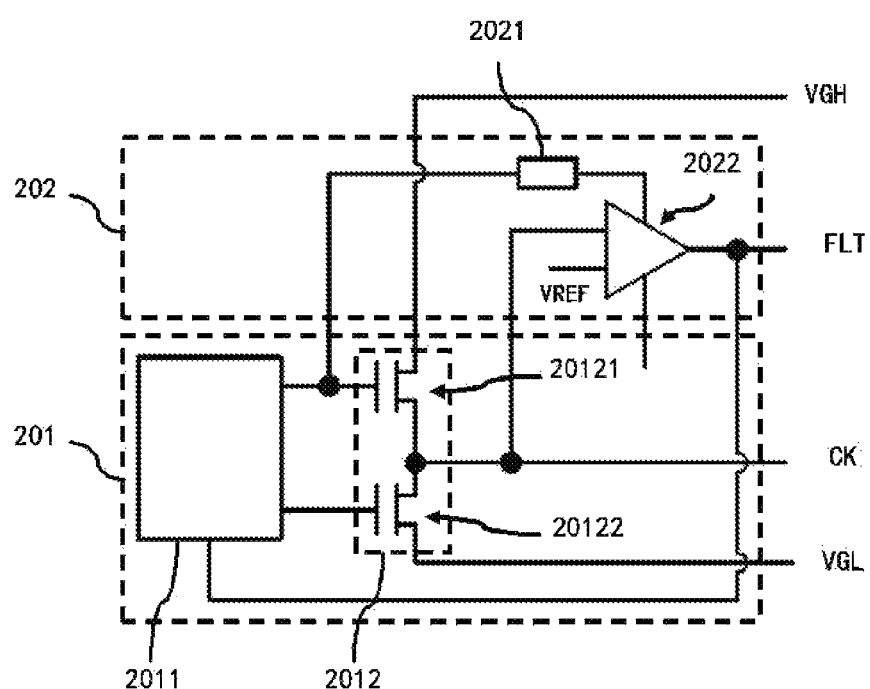
FIG. 3 illustrates a circuit diagram of the level shifter circuit shown in FIG. 2.

Please refer to FIG. 1, FIG. 2, and FIG. 3. FIG. 1 illustrates a diagram of a display panel of the present disclosure. FIG. 2 illustrates a block diagram of a level shifter circuit of the present disclosure. FIG. 3 illustrates a circuit diagram of the level shifter circuit shown in FIG. 2.

A display panel 10 of the present disclosure can be a thin-film transistor liquid crystal display (TFT-LCD), an organic light-emitting diode (OLED) display panel, etc. The display panel 10 includes a panel main body 101 and a driving circuit 102. The panel main body 101 is electrically connected to the driving circuit 102. The driving circuit 102 is disposed on one side of the panel main body 101. The driving circuit 102 includes at least one of a scan driving circuit or a data driving circuit. The driving circuit 102 further includes an integrated power management circuit and the level shifter circuit. Furthermore, the driving circuit 102 further includes a timer control register (TCON). The TCON is electrically connected to the level shifter circuit. The integrated power management circuit is electrically connected to the level shifter circuit, and the integrated power management circuit is configured to provide a first voltage signal and a second voltage signal to the level shifter circuit. The level shifter circuit may be electrically connected to the scan driving circuit and/or the data driving circuit. The level shifter circuit is configured to provide a level shifter result signal to the scan driving circuit and/or the data driving circuit.

The level shifter circuit includes a level shifter module 201 and a compare module 202. The level shifter module 201 is electrically connected to the compare module 202. The level shifter module 201 includes a level shifter unit 2012 and a control unit 2011 connected to the level shifter unit 2012.

The level shifter unit 2012 is configured to receive the first voltage signal and the second voltage signal, and configured to generate the level shifter result signal according to the first voltage signal and the second voltage signal.

The first voltage signal may be, for example, a high voltage signal (higher than a predetermined threshold), and the second voltage signal may be, for example, a low voltage signal (lower than the predetermined threshold). The level shifter result signal may be a clock signal or other signals similar to the clock signal.

The compare module 202 is configured to compare a voltage corresponding to the level shifter result signal with a reference voltage at a predetermined time, generate a compare result (signal), and feedback the compare result to the control unit 2011.

The control unit 2011 is configured to control the level shifter unit to stop operating when the compare result is that the voltage corresponding to the level shifter result signal is less than the reference voltage, and is configured to control the level shifter unit to normally operate when the compare result is that the voltage corresponding to the level shifter result signal is greater than or equal to the reference voltage.

The level shifter unit 2012 is controlled to stop generating the level shifter result signal when the compare result is that the voltage corresponding to the level shifter result signal is less than the reference voltage at the predetermined time, and controlled to generate the level shifter result signal when the compare result is that the voltage corresponding to the level shifter result signal is greater than or equal to the reference voltage at the predetermined time.

The driving circuit 102 is shorted when the voltage corresponding to the level shifter result signal is less than the reference voltage.

The driving circuit 102 is not shorted when the voltage corresponding to the level shifter result signal is greater than or equal to the reference voltage.

When the driving circuit 102 is shorted, a raising speed of a raising edge of the level shifter result signal generated by the level shifter circuit of the driving circuit 102 slows down. As a result, the voltage corresponding to the level shifter result signal cannot reach a predetermined voltage (the reference voltage) after then predetermined time. Therefore, in the present disclosure compares the voltage corresponding to the level shifter result signal with the reference voltage by utilizing the compare module 202 in order to determine whether the voltage corresponding to the level shifter result signal is less than the reference voltage. If yes, the driving circuit 102 is shorted. If not, the driving circuit 102 is not shorted.

The reference voltage a voltage that the level shifter result signal will reach after the predetermined time in normal conditions (i.e. a condition that the driving circuit 102 is not shorted). The reference voltage is preset.

The level shifter unit 2012 includes a first three-end transistor 20121 and a second three-end transistor 20122. The control unit 2011 includes a first control signal output end and a second control signal output end. The first control signal output end is electrically connected to the first three-end transistor 20121. The second control signal output end is electrically connected to the second three-end transistor 20122. The control unit 2011 is configured to control the first three-end transistor 20121 and the second three-end transistor 20122 to be turned on or off.

The control unit 2011 is configured to control the first three-end transistor 20121 and the second three-end transistor 20122 to be turned on or off to generate the level shifter result signal when the voltage corresponding to the level shifter result signal is greater than or equal to the reference voltage at the predetermined time. More particularly, the control unit 2011 is configured to control the first three-end transistor 20121 to be turned on and the second three-end transistor 20122 to be turned off in a first duration when the voltage corresponding to the level shifter result signal is greater than or equal to the reference voltage at the predetermined time. The second three-end transistor 20122 is turned off when the first three-end transistor 20121 is turned on. The second three-end transistor 20122 is turned on when the first three-end transistor 20121 is turned off.

The control unit 2011 is configured to control the first three-end transistor 20121 and the second three-end transistor 20122 to be turned off (both of them are turned off) to stop generating the level shifter result signal when the voltage corresponding to the level shifter result signal is less than the reference voltage at the predetermined time.

The level shifter module 201 further includes a first voltage signal input end VGH, a second voltage signal input end VGL, and a level shifter result signal output end CK.

The first three-end transistor 20121 includes a first control end, a first input end, and a first output end. The first control electrode is electrically connected to the first control signal output end. The first input end is electrically connected to the first voltage signal input end VGH, and the first output end is electrically connected to the level shifter result signal output end CK.

The second three-end transistor 20122 includes a second control end, a second input end, and a second output end. The second control end is electrically connected to the second control signal output end. The second input end is electrically connected to the second voltage signal input end VGL, and the second output end is electrically connected to the level shifter result signal output end CK.

The level shifter result signal output end CK is configured to output the level shifter result signal.

In the present disclosure, "at the predetermined time" means that viewing a time when the first three-end transistor 20121 is controlled to be turned on by the control unit 2011 (the first of the first voltage signal input terminal VGH at this time) as a start time, after the predetermined time of the start time is at the predetermined time.

The compare module 202 includes a delay controller 2021 and a comparator 2022. The delay controller 2021 is electrically connected to the comparator 2022 and the control unit 2011. The delay controller 2021 is configured to delay a control signal of the control unit 2011 for the predetermined time before being transmitted to the comparator 2022.

The delay controller 2021 includes the first control signal input end and a third control signal output end. The first control signal input terminal is electrically connected to the first control signal output end.

As an improvement, the compare module 202 further includes a delay switch which is connected to the delay controller 2021 and the comparator 2022. The delay switch is configured to turn on a current path between the delay controller 2021 and the comparator 2022 at the predetermined time.

The comparator 2022 includes a reference voltage signal input end VREF, a awaiting-compare voltage signal input end, a second control signal input end, and a compare result signal output end, FLT. The second control signal input end is electrically connected to the third control single output end. The awaiting-compare voltage signal input end is electrically connected to the level shifter result signal output end CK.

The control unit further includes a feedback signal input end electrically connected to the compare result signal output end FLT. The control unit 2011 receives the compare result (signal) through the feedback signal input end.

The predetermined time is between 10 nanoseconds (ns) to 5000 ns. For example, the predetermined time can be 10 ns, 20 ns, 30 ns, 40 ns, 50 ns, 60 ns, 70 ns, 80 ns, 90 ns, 100 ns, 110 ns, 120 Ns, 130 ns, 140 ns, 150 ns, 160 ns, 170 ns, 180 ns, 190 ns, 200 ns, 250 ns, 300 ns, 350 ns, 400 ns, 450 ns, 500 ns, 550 ns, 600 ns, 650 ns, 700 ns, 750 ns, 800 ns, 850 ns, 900 ns, 950 ns, 1000 ns, 1500 ns, 2000 ns, 2500 ns, 3000 ns, 3500 ns, 4000 ns, 4500 ns, or 5000 ns.

Preferably, the predetermined time is 100 ns.

The level shifter circuit of the present disclosure includes the following technical solutions.

When the driving circuit 102 in the display panel 10 operates normally, the comparator 2022 starts operating after the first three-end transistor 20121 is turned on (i.e. delay) for 100 ns, At this moment, the voltage of the level shifter result signal is greater than the reference voltage. The comparator 2022 outputs 0 and feedbacks to the control unit 2011 to make the control unit 2011 control the first three-end transistor 20121 and the second three-end transistor 20122 to keep outputting.

When the driving circuit 102 of the display panel 10 is shorted, the rising speed of the level shifter result signal slows down, the comparator 2022 starts operating after the first three-end transistor 20121 is turned on (i.e. delay) for 100 ns, At this moment, the voltage of the level shifter result signal is less than the reference voltage. The comparator 2022 outputs 1 and feedbacks to the control unit 2011 to make the control unit 2011 control the first three-end transistor 20121 and the second three-end transistor 20122 not to output so the melt of the display panel 10 is prevented.

In the above technical solutions, because the compare module 202 compares the voltage corresponding to the level shifter result signal with a reference voltage at the predetermined time and generates the comparison result (signal), The comparison result (signal)) is configured to control the shifter module 201 stop generating the level shifter result signal when the voltage corresponding to the level shifter result signal is less than the reference voltage at the predetermined so that the display panel 10 can be prevented from damages resulted from short circuiting.

To conclude, although the present disclosure has been disclosed by above-mentioned preferred embodiments, the above-mentioned preferred embodiments are not limitations to the present disclosure. Variations and modifications can be obtained by a person skilled in the art without departing from the aspect and scope of the present disclosure. Therefore, the protected scope of the present disclosure is subject to the defined scope of claims.

What is claimed is:

1. A level shifter circuit, wherein the level shifter circuit comprises a level shifter module and a compare module connected to the level shifter module, wherein the level shifter module comprises a level shifter unit and a control unit connected to the level shifter unit;
   wherein the level shifter unit is configured to receive a first voltage signal and a second voltage signal, and configured to generate a level shifter result signal according to the first voltage signal and the second voltage signal;
   wherein the compare module is configured to compare a voltage corresponding to the level shifter result signal with a reference voltage at a predetermined time, configured to generate a compare result, and configured to feed back the compare result to the control unit;
   wherein the control unit is configured to control the level shifter unit to stop operating in response to the compare result that the voltage corresponding to the level shifter result signal is less than the reference voltage;
   wherein the control unit is configured to control the level shifter unit to normally operate in response to the compare result that the voltage corresponding to the level shifter result signal is greater than or equal to the reference voltage;
   wherein the compare module comprises a delay controller and a comparator, the delay controller is electrically connected to the comparator and the control unit, and the delay controller is configured to delay a control signal of the control unit for the predetermined time before being transmitted to the comparator;

wherein the driving circuit is shorted in response to a condition that the voltage corresponding to the level shifter result signal is less than the reference voltage; and wherein the driving circuit is not shorted in response to a condition that the voltage corresponding to the level shifter result signal is greater than or equal to the reference voltage.

2. The level shifter circuit according to claim 1, wherein the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

3. A level shifter circuit, wherein the level shifter circuit comprises a level shifter module and a compare module connected to the level shifter module, wherein the level shifter module comprises a level shifter unit and a control unit connected to the level shifter unit;

wherein the level shifter unit is configured to receive a first voltage signal and a second voltage signal, and configured to generate a level shifter result signal according to the first voltage signal and the second voltage signal;

wherein the compare module is configured to compare a voltage corresponding to the level shifter result signal with a reference voltage at a predetermined time, configured to generate a compare result, and configured to feedback the compare result to the control unit;

wherein the control unit is configured to control the level shifter unit to stop operating in response to the compare result that the voltage corresponding to the level shifter result signal is less than the reference voltage; and wherein the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

4. The level shifter circuit according to claim 3, wherein the control unit is further configured to control the level shifter unit to normally operate in response to the compare result that the voltage corresponding to the level shifter result signal is greater than or equal to the reference voltage.

5. The level shifter circuit according to claim 3, wherein the control unit is configured to control the first three-end transistor and the second three-end transistor to be turned on or off to generate the level shifter result signal in response to a condition that the voltage corresponding to the level shifter result signal is greater than or equal to the reference voltage at the predetermined time, and configured to control the first three-end transistor and the second three-end transistor to be turned off to stop generating the level shifter result signal in response to a condition that the voltage corresponding to the level shifter result signal is less than the reference voltage at the predetermined time.

6. The level shifter circuit according to claim 3, wherein the level shifter module further comprises a first voltage signal input end, a second voltage signal input end, and a level shifter result signal output end;

the first three-end transistor comprises a first control end, a first input end, and a first output end, the first control end is electrically connected to the first control signal output end, the first input end is electrically connected to the first voltage signal input end, and the first output end is electrically connected to the level shifter result signal output end;

the second three-end transistor comprises a second control end, a second input end, and a second output end, the second control end is electrically connected to the second control signal output end, the second input end is electrically connected to the second voltage signal input end, and the second output end is electrically connected to the level shifter result signal output end; and the level shifter result signal output end is configured to output the level shifter result signal.

7. The level shifter circuit according to claim 3, wherein the compare module further comprises a delay controller and a comparator, wherein the delay controller is electrically connected to the comparator and the control unit, and the delay controller is configured to transmit a control signal of the control unit to the comparator after delayed for the predetermined time then transmits.

8. The level shifter circuit according to claim 7, wherein the compare module further comprises a delay switch, the delay switch is electrically connected to the delay controller and the comparator and is configured to turn on a current path between the delay controller and the comparator at the predetermined time.

9. The level shifter circuit according to claim 7, wherein the delay controller further comprises a first control signal input end and a third control signal output end, and the first control signal input end is electrically connected to the first control signal output end; and the comparator comprises a reference voltage signal input end, a awaiting-compare voltage signal input end, a second control signal input end, and a compare result signal output end, the second control signal input end is electrically connected to the third control single output end, and the awaiting-compare voltage signal input end is electrically connected to the level shifter result signal output end of the level shifter module.

10. The level shifter circuit according to claim 9, wherein the control unit further comprises a feedback signal input end electrically connected to the compare result signal output end.

11. A display panel, wherein the display panel comprises a panel main body and a driving circuit, the panel main body is electrically connected to the driving circuit, the driving circuit comprises a level shifter circuit, the level shifter circuit comprises a level shifter module and a compare module connected to the level shifter module, and the level shifter module comprises a level shifter unit and a control unit connected to the level shifter unit;

wherein the level shifter unit is configured to receive a first voltage signal and a second voltage signal, and configured to generate a level shifter result signal according to the first voltage signal and the second voltage signal;

wherein the compare module is configured to compare a voltage corresponding to the level shifter result signal and a reference voltage at a predetermined time, and configured to generate a compare result, and configured to feedback the compare result to the control unit; and wherein the control unit is configured to control the level shifter unit to stop operating in response to the compare result that the voltage corresponding to the level shifter result signal is less than the reference voltage; and wherein the level shifter unit comprises a first three-end transistor and a second three-end transistor, the control unit comprises a first control signal output end and a second control signal output end, wherein the first control signal output end is electrically connected to the first three-end transistor, the second control signal output end is electrically connected to the second three-end transistor, and the control unit is configured to control the first three-end transistor and the second three-end transistor to be turned on or off.

12. The display panel according to claim 11, wherein the control unit is further configured to control the level shifter unit to normally operate in response to the compare result that the voltage corresponding to the level shifter result signal is greater than or equal to the reference voltage.

13. The display panel according to claim 11, wherein the control unit is configured to control the first three-end transistor and the second three-end transistor to be turned on or off to generate the level shifter result signal in response to a condition that the voltage corresponding to the level shifter result signal is greater than or equal to the reference voltage at the predetermined time; and configured to control the first three-end transistor and the second three-end transistor to be turned off to stop generating the level shifter result signal in response to a condition that the voltage corresponding to the level shifter result signal is less than the reference voltage at the predetermined time.

14. The display panel according to claim 11, wherein the level shifter module further comprises a first voltage signal input end, a second voltage signal input end, and a level shifter result signal output end;

the first three-end transistor comprises a first control end, a first input end, and a first output end, the first control end is electrically connected to the first control signal output end, the first input end is electrically connected to the first voltage signal input end, and the first output end is electrically connected to the level shifter result signal output end;

the second three-end transistor comprises a second control end, a second input end, and a second output end, the second control end is electrically connected to the second control signal output end, the second input end is electrically connected to the second voltage signal input end, and the second output end is electrically connected to the level shifter result signal output end;

the level shifter result signal output end is configured to output the level shifter result signal.

15. The display panel according to claim 11, wherein the compare module further comprises a delay controller and a comparator, wherein the delay controller is electrically connected to the comparator and the control unit, and the delay controller is configured to transmit a control of the control unit to the comparator after delayed for the predetermined time then transmits.

16. The level shifter circuit according to claim 15, wherein the compare module further comprises a delay switch, the delay switch is electrically connected to the delay controller and the comparator and is configured to turn on a current path between the delay controller and the comparator at the predetermined time.

17. The display panel according to claim 15, wherein the delay controller further comprises a first control signal input end and a third control signal output end, the first control signal input end is electrically connected to the first control signal output end;

the comparator comprises a reference voltage signal input end, a awaiting-compare voltage signal input end, a second control signal input end, and a compare result signal output end, the second control signal input end is electrically connected to the third control single output end, the awaiting-compare voltage signal input end is electrically connected to the level shifter result signal output end of the level shifter module.

18. The display panel according to claim 17, wherein the control unit further comprises a feedback signal input end electrically connected to the compare result signal output end.

* * * * *